United States Patent [19]

Johnson et al.

[11] Patent Number: 5,491,449
[45] Date of Patent: Feb. 13, 1996

[54] DUAL-SIDED PUSH-PULL AMPLIFIER

[75] Inventors: Edwin F. Johnson, Sunnyvale; Douglas G. Lockie, Monte Sereno; Clifford A. Mohwinkel, San Jose, all of Calif.

[73] Assignee: Endgate Technology Corporation, Sunnyvale, Calif.

[21] Appl. No.: 155,030

[22] Filed: Nov. 19, 1993

[51] Int. Cl.$^6$ .................................. H03F 3/26; H03F 3/16
[52] U.S. Cl. .................................................. 330/269; 330/65
[58] Field of Search ........................... 330/65, 66, 67, 330/68, 262, 263, 264, 269, 276; 505/855

[56] References Cited

U.S. PATENT DOCUMENTS

| | | | |
|---|---|---|---|
| 4,097,814 | 6/1978 | Cohn | 330/269 X |
| 5,142,239 | 8/1992 | Brayton et al. | 330/66 |
| 5,355,095 | 10/1994 | Nathanson et al. | 330/264 |

Primary Examiner—Steven Mottola
Attorney, Agent, or Firm—Edward B. Anderson

[57] ABSTRACT

A Dual-Sided Push-Pull Amplifier for providing a high-gain yet low-cost amplifier capable of operating at frequencies extending above 1 GHz is disclosed. The present invention may be used in any application in which low cost amplification may be desired, including transmitters, antenna arrays, radars, light wave modulators, mixers, local oscillators, driver amplifiers and microwave ovens. One of the preferred embodiments of the invention (10d/10e) utilizes two pairs of field effect transistors (FETs) (22U and 22L & 24U and 24L) mounted in registration on both faces (12a & 12b) of a dual-sided dielectric substrate (12). The sources (22US and 22LS & 24US and 24US) on both faces of the FETs (22 & 24) are electrically coupled and are located at a minimum distance from their mates on the opposite faces of the substrate (12) to reduce inter-FET source lead inductance. The FETs (22 & 24) are coupled to a set of conductors (16a, 16b, 16c & 16d) which are formed on the substrate (12). These conductors (16a, 16b, 16c & 16d) are deployed in a substantially symmetric pattern about the active devices (14d & 14e) as opposing pairs in registration across the substrate (12), and are located in positions that are substantially equidistant from the active devices (14d & 14e). The conductors (16a, 16b, 16c & 16d) are arranged to allow an equal and opposed input signal (i) to flow through conductors 16a and 16b. An amplified signal gi (gain x input current) is produced in conductors 16c and 16d. Electrically conductive vias (17) may extend between faces (12a) and (12b) to facilitate electrical connections between the sources of the active devices (14d & 14e) on either side of the substrate (12). Power is supplied to the active devices (14) through terminals (18). A miniature heat pipe (19) may be formed within substrate (12) and contains a liquid, gas or solid material that is capable of conducting unwanted heat away from the active devices (14d & 14e) or for temporarily storing unwanted heat from the active devices.

14 Claims, 15 Drawing Sheets

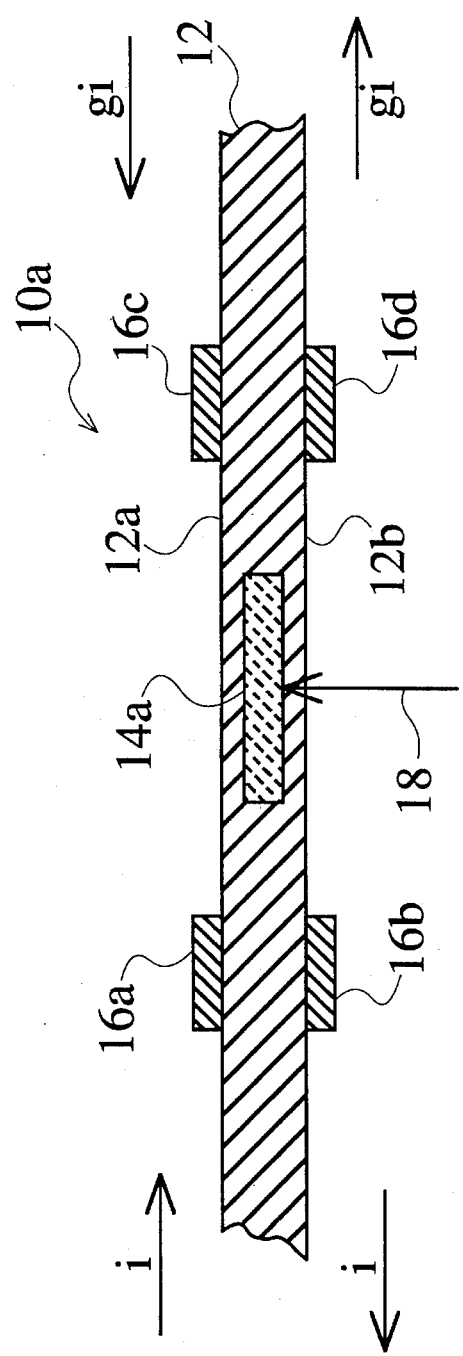
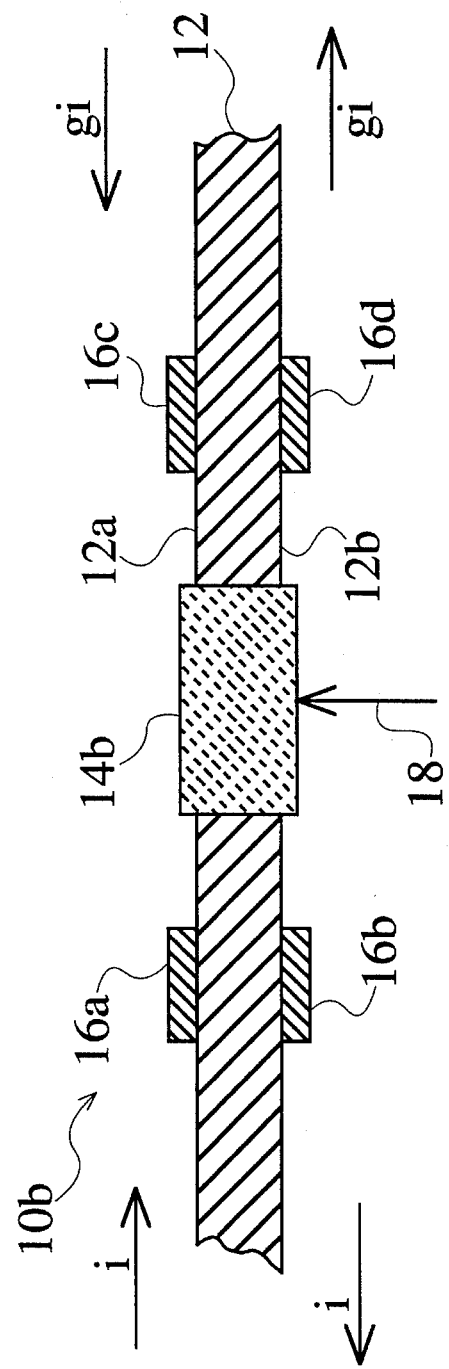
Fig. 2
Fig. 3

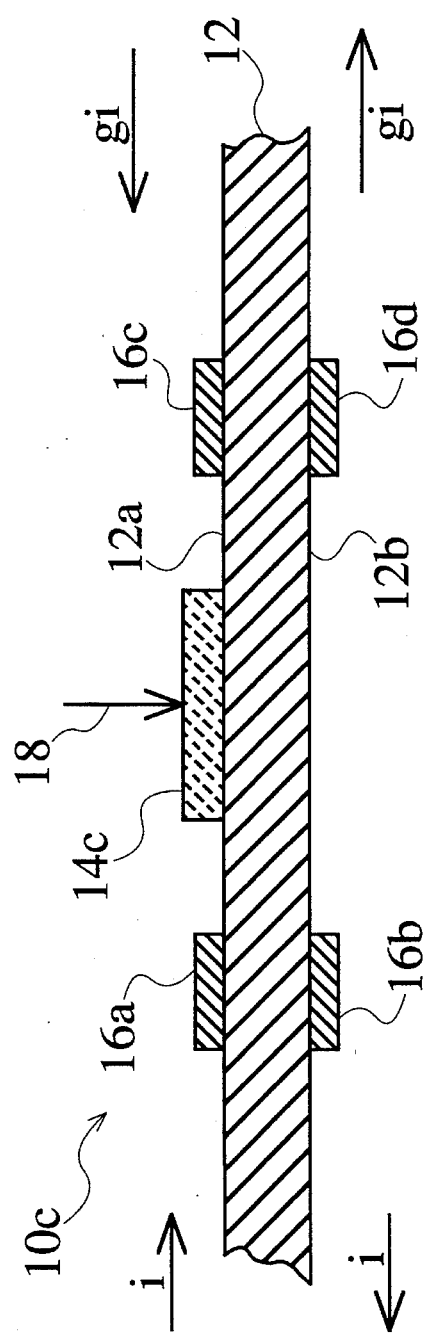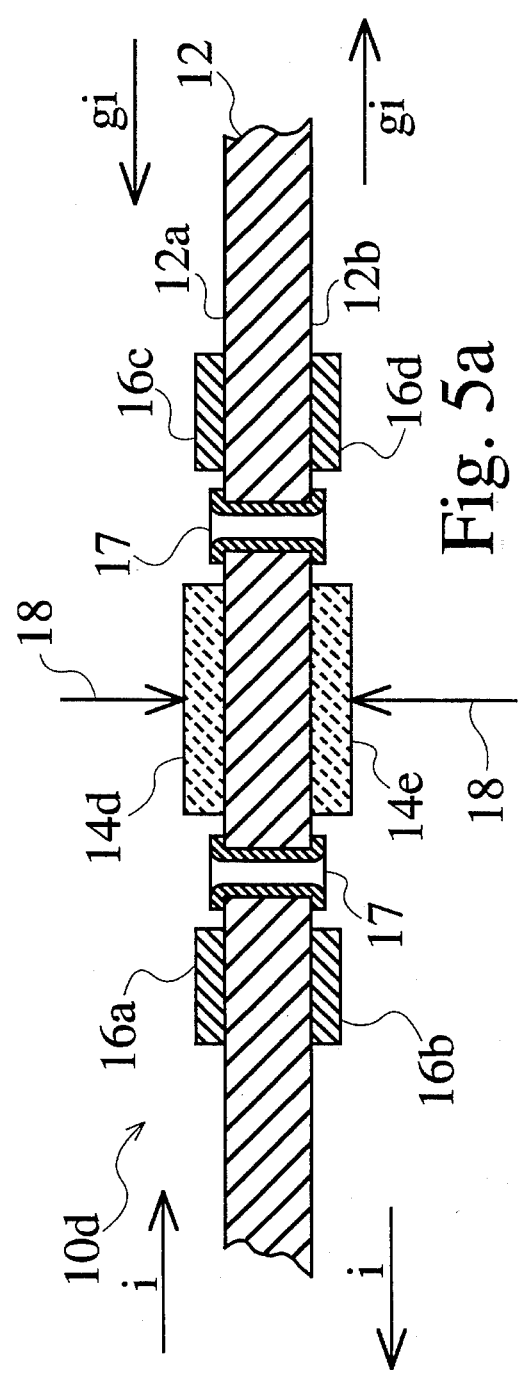

DUAL-SIDED PUSH-PULL AMPLIFIER

FIELD OF THE INVENTION

The present invention relates to the field of microwave and millimeter wave amplifiers. More particularly, this invention provides a low-cost high-gain gallium arsenide power amplifier that may be used in transmitters, transducers, antenna arrays and radars.

BACKGROUND OF THE INVENTION

Recent advances in the fields of microelectronics have enabled the production and use of components which operate at microwave and millimeter wave frequencies. These components include power amplifiers that may operate in complex telecommunication systems or in relatively simple household appliances like microwave ovens. One type of previous power amplifier is called a "push-pull" amplifier. FIG. 1 presents a simplified diagram of a push-pull amplifier PPA from the text by John P. Steiner entitled An Illustrated Guide to Basic Electronics published by Prentice-Hall in 1984. The amplifier PPA includes two transistors Q1 and Q2. An alternating current input is applied to the primary coil of a transformer T. The signal from the secondary coil supplies an input to transistors Q1 and Q2. Since the input signals to the transistors are always in opposite polarity, one transistor conducts while the other is cut off. This device is called a push-pull amplifier because each of the pair of transistors works in opposition to amplify the input signal. See Steiner, pp. 222–223. The amplifier shown in FIG. 1 is a push-pull amplifier in the strictest sense. This means that the current that flows into the control terminal of the first device is exactly equal to and opposite to the current that flows out of the control terminal of the second device. These currents also flow through the common terminal that couples the two devices. This particular example of a PPA has a single-ended output, but this is not a requirement. The output could be balanced just as well.

Several recent papers on microwave push-pull amplifiers are listed below. These papers describe amplifiers that are designed to operate in the microwave and millimeter wave frequencies. None of these amplifiers, however, is push-pull in the strict sense defined above.

*FET-Based Planar Circuits for Quasi-Optical Sources and Transceivers* by Joel Birkeland and Tasu Itoh, published in IEEE Transactions on Microwave Theory and Techniques, Vol. 37, No. 9, p. 1452, September 1989. Birkeland et al. disclose transmitter and transceiver microwave circuits.

*Six to Eighteen GHz Single-Ended and Push-Pull MMIC Amplifiers for High-Gain Modules* by R. Ramachandran et al., published in IEEE 1988 Microwave and Millimeter-Wave Monolithic Circuits Symposium, p. 15, 1988. The authors discuss two single-ended amplifiers connected in push-pull fashion which are designed for the highest possible gain efficiency.

*Complementary, HBT Push-Pull Amplifier by Selective MBE* by K. W. Kobayashi et al., published in IEEE Microwave and Guided Wave Letters, Vol. 2, No. 4, p. 149, April, 1992. The authors disclose a GaAs heterojunction bipolar transistor amplifier that operates at microwave frequencies.

*A Wide-Band Push-Pull Amplifier Upgrades IP2* by M. C. Tsai, published in 1990 IEEE MTT-S Digest, p. 511, IEEE, 1990. Tsai describes a push-pull amplifier that utilizes Lange coupler baluns.

*New Broadband Balun Structures for Monolithic Microwave Integrated Circuits* by B. J. Minnia and M. Healy, published in 1991 IEEE MTT-S Digest, p. 425, IEEE, 1991. Minnia and Healy disclose two passive balun structures that are intended for use in MMIC push-pull power amplifiers.

*Broad-Band Push-Pull Power Amplifier* by Sachihiro Toyoda, published in 1990 IEEE MTT-S Digest, p. 507, IEEE, 1990. Toyoda describes a broad-band phase inverter that is necessary for use in his push-pull amplifier.

*A Ku-Band Oscillator Subsystem Using a Broadband GaAs MMIC Push-Pull Amplifier/Doubler* by Robert Martin and Fazal Ali, published in IEEE Microwave and Guided Wave Letters, Vol. 1, No. 11, p. 348, November, 1991. Martin and Ali describe a voltage controlled oscillator subsystem that is used as a frequency doubler.

In a practical sense, conventional push-pull amplifiers provide higher gain due to lower common lead inductance. The overall efficiency of the amplifier is improved, and the higher gain supplied by each amplifier stage enables circuit designers to employ fewer stages to achieve a given level of gain. Since the number of stages is reduced, variations in the gain of multistage amplifiers due to temperature are reduced. Other benefits realized by minimizing the number of amplifier stages include enhanced reliability and lower manufacturing cost.

Compared to other types of amplifiers, push-pull amplifiers also offer the desirable characteristics of higher input and output impedance. This is a result of the fact that push-pull devices have their input and outputs connected in a series configuration. These features result in lower loss due to relatively lower transformation ratios, improved efficiency and greater bandwidth. The push-pull circuit also provides even harmonic suppression which not only can augment the output power, but also requires less filtering.

Conversely, push-pull designs are usually much more difficult to implement. In general, the current state of the art does not include high-gain yet low-cost push-pull amplifiers (in the strict sense) that operate at frequencies above 2 GHz. Previous push-pull circuits intended for use above the 2 GHz frequency range have generally been constructed using two single-ended, non push-pull amplifiers combined with a device that introduces a 180 degree phase shift. The only advantages supplied by this configuration are those associated with harmonic cancelling.

The development of power microwave amplifiers has presented a major challenge to designers in the field of microelectronics. The development of a low cost, highly efficient, high gain power amplifier which is capable of operating at microwave and millimeter wave frequencies would constitute a major technological advance and would satisfy a long felt need in the electronics and telecommunications industries.

SUMMARY OF THE INVENTION

The embodiments of the Dual-Sided Push-Pull Amplifier described and claimed below overcome the problems encountered by previous push-pull approaches to amplifier circuits that operate at frequencies above 1 GHz. One of the preferred embodiments of the invention utilizes two pairs of field effect transistors (FETs) aligned and mounted on opposite sides of a substrate. The two pairs of active devices are attached to the substrate using "flip-chip" technology. The source terminals of the active devices are deployed so that the distances separating them is minimized, which, in turn, minimizes inter-FET source lead inductance. A pair of conductors is located on both sides of each substrate in a generally symmetric pattern, and may be coupled to the active devices by conductive pathways, or may be coupled capacitively, inductively, optically or acoustically. An equal and opposed input signal i flows through one pair of conductors, while an amplified signal gi (gain x input current) is produced in the second pair of conductors. The present invention operates in a push-pull mode not only because a pair of transistors work together alternately to amplify an input, but also because a pair of equal and opposite input currents produces a pair of equal and opposite output currents. These currents are equal and opposite as a consequence of the physical structure of the substrate, its conductor pattern, and the method of coupling to them.

In one embodiment, the invention is mounted in a test fixture that may be connected to external circuitry. The active device and its accompanying components, that are collectively referred to as the "power module" are joined to a pair of matched heat dissipating grounding clamps. The clamps not only provide mechanical support for the power module, but also remove heat from the terminals and supply an electrical ground to the amplifier. The power module and the clamp are substantially surrounded by a test fixture which includes baluns and connects to the input and output terminals of the power module.

An appreciation of other aims and objectives of the present invention and a more complete and comprehensive understanding of this invention may be achieved by studying the following description of a preferred embodiment and by referring to the accompanying drawings.

A BRIEF DESCRIPTION OF THE DRAWINGS

FIG. 2 is a cross-sectional view of a portion of the present invention showing an active device embedded in a substrate.

FIG. 3 is a cross-sectional view of a portion of the present invention showing an active device which protrudes through both sides of a substrate.

FIG. 4 is a cross-sectional view of a portion of the present invention showing an active device mounted on one face of a substrate.

FIG. 5a is a cross-sectional view of a portion of the present invention showing a pair of active devices which are each mounted on opposite faces of a substrate.

Figure 1:
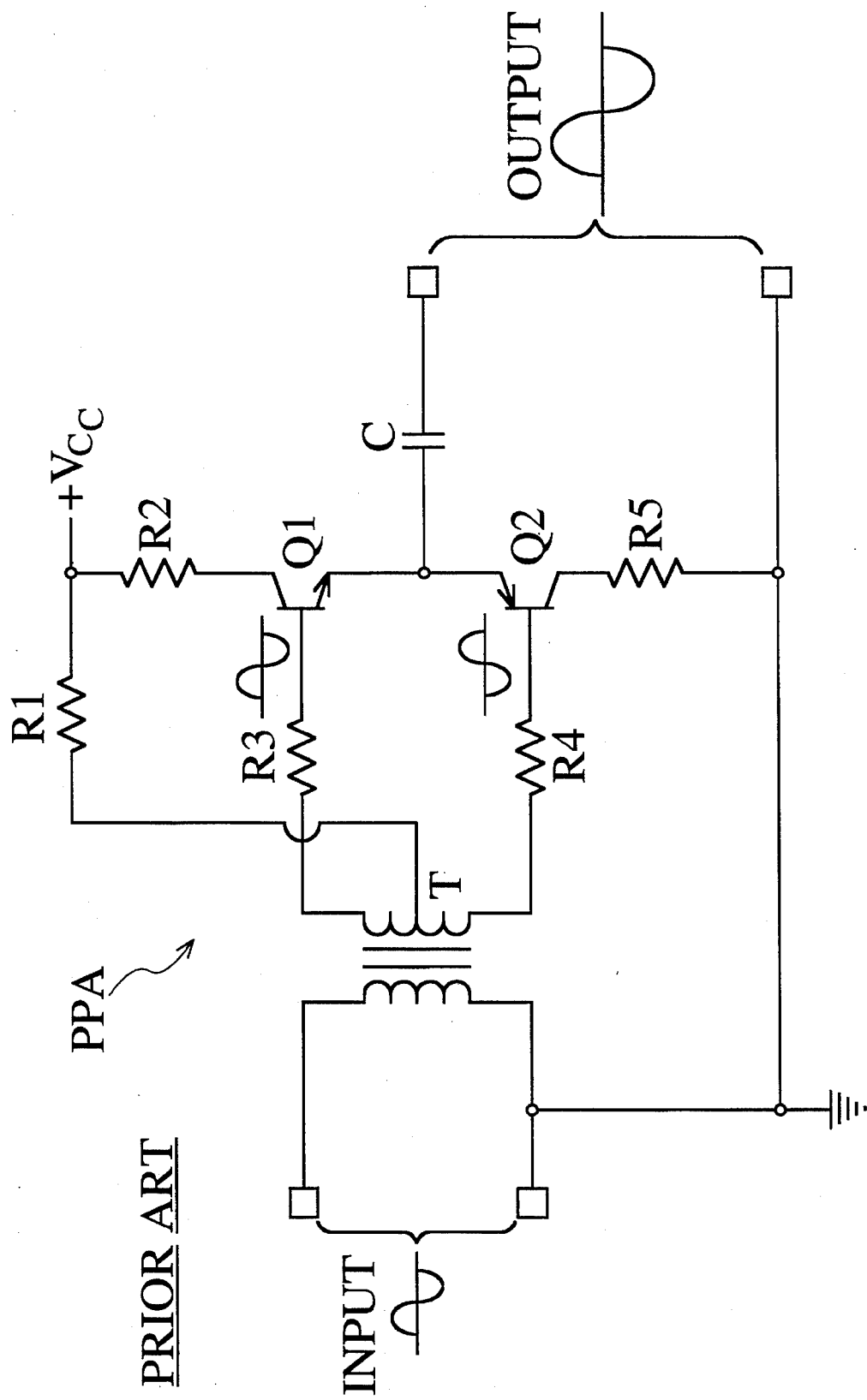
FIG. 1 is a schematic diagram of a conventional push-pull amplifier.

FIGS. 17a, 17b, 18, 19, 20 and 21 reveal additional alternative embodiments of the invention.

A DETAILED DESCRIPTION OF PREFERRED EMBODIMENTS

The present invention comprises a multi-purpose power amplifier 10 that is capable of generating power at microwave and millimeter wave frequencies above 1 GHz. The present invention operates in a push-pull mode not only because a pair of transistors work together to alternately amplify an input, but also because a pair of equal and opposite input currents that are defined by the structure produce a pair of equal and opposite output currents. The various embodiments of the amplifiers described below provide high input and output impedance, a symmetric drive waveform, even harmonic cancelling, and low common lead inductance. In the detailed description that follows, the terms "upper" and "lower" are relative descriptions intended to assist the reader in interpreting the drawings and are not intended to limit the scope of the claims. The drawings that accompany this specification are generally illustrative and are not shown in exact scale or proportion.

FIGS. 2, 3, 4, 5a and 5b provide cross-sectional views of various preferred embodiments of the present invention. Each of these four designs utilizes a dielectric substrate 12. In these preferred embodiments, the substrate is a planar layer 12 which has two sides or faces, 12a and 12b. In a preferred embodiment, the substrate is a layer of fired beryllium oxide that is approximately 0.015 inches thick. Alternative materials that may be employed include aluminum oxide, aluminum nitride, sapphire, quartz, diamond and various plastics and films. In the claims which follow this specification, the term "spacing means" is used to describe this substrate 12, because the primary purpose of the substrate is to help maintain the spatial relationships among the circuit elements that are coupled to it. The substrate may be fabricated from any material, framework or array of separators that is capable of defining the appropriate physical configuration of the elements of the invention. In the preferred embodiment, the material that is selected for the substrate should have a relatively high thermal conductivity. The spacing means need not be homogeneous, and can be made of different multi-layered substances. In some alternative embodiments of the invention, the requirement for high thermal conductivity may not always be important. In the embodiments shown in FIGS. 2, 3, 4, 5a and 5b, the substrate should also be somewhat stiff. Some alternative embodiments may utilize flexible or non-rigid substrates. Ideally, the metal conductors 16 described below would adhere to the spacer layer 12. The spacer layer 12 may also match the thermal expansion characteristics of the active devices being used, but this is not a necessity.

FIG. 2 reveals a cross-sectional view 10a of a single active device 14a embedded within the substrate 12. In this specification and in the claims that follow, the terms "active device" and "active device means" (identified as 14 or 14a, b, c, d or e) refer to any component that produces gain. While the preferred embodiment of the invention utilizes gallium arsenide (GaAs) field effect transistors (FETs), the active device 14 may include one or more devices having two or three or more terminals that provide gain, including, but not limited to, RF amplifiers, bipolar transistors, flux flow transistors, Gunn diodes, tunnel diode amplifiers, optical amplifiers, Impart diode amplifiers, traveling wave tubes or lasers.

In general, the active device 14 is "signal-coupled" to a set of conductors 16 which are formed on the substrate 12. The term "signal coupled" refers to the transmission of a signal between two circuit elements. In the preferred embodiments of the invention, these conductors 16a, 16b, 16c and 16d are deployed as opposing pairs on both faces of the dielectric 12a and 12b. They are generally in registry on opposite faces of the substrate 12, and each reside in positions that are substantially equidistant. Although the conductors are formed from metal in the preferred embodiment, superconducting materials may also be employed as a material for one or more of the conductors. The spacing means need not have a uniform thickness from the active devices 14. Even in FIG. 4, both pairs of conductors 16a and 16c and conductors 16b and 16d are substantially equidistant from the active device 14c, even though the distances between the active device 14c and the pairs are unequal. The conductors 16 may be signal coupled to the active device 14 by direct conductive pathways, or may be coupled by capacitive, inductive, optical or acoustical means. Any arrangement which allows an equal and opposed input signal i to flow through conductors 16a and 16b which, in turn, produces an amplified signal gi (gain x input current) in conductors 16c and 16d will suffice. The designation of the symbol "i" does not limit the signal to the current domain, and may be a signal comprising electrical, acoustic, optical, mechanical or any other form of energy. Power gain may be provided with current gain g less than one through impedance transformation.

Amplifiers usually are designed to minimize the conversion of signal power into other frequencies. This is not an absolute requirement, however, of the module described herein. In fact, a parametric amplifier, by nature of its operation, can be have different input and output frequencies, and these may not even be harmonically related. A number of useful electronic devices, including harmonic generators, can be made by adapting the circuitry of the push-pull module described in this specification to give an output whose signal frequencies are different from the input signal frequencies. The symbol for the output, gi, is intended in a generalized sense to represent the useful output signal from the push-pull module. It need not be limited to a simple constant times the input electrical current. In fact, the input current, i, is meant to represent any signal that is capable of having information impressed upon it. For example, the symbol "i" can represent a signal that may be electronic, acoustic or optical.

In general, the conductors 16 are deployed in a generally symmetric pattern around the active device 14. In this specification and in the claims that follow, the term "electromagnetic coupling" generally refers to a relationship between elements of the invention in which the elements are arranged in a spatial pattern such that they are close enough to interact electromagnetically. In contrast, the term "mechanically-coupled" refers to the physical connection or attachment between elements of the invention.

In each of the four embodiments shown in FIGS. 2, 3, 4, 5a and 5b, the active device 14 receives power and may be controlled by a signal applied at terminal 18. The active device 14 may also be controlled by signals applied through conductors 16a and 16b. If the active device is a field effect transistor, it may be turned off by adjusting the gate bias to pinch off the FET or by removing power from the drain terminal. If the active device is a device other than a FET, it still can be turned off by removing the power supply or by using the control terminal in a manner that turns off the active device.

Not only can active devices be turned off and on as described in the previous paragraph, but the output signal can also be modulated in this way. Such modulation might be done for various purposes and could vary from small-signal to full on-off voltage swings. This structure can be used to construct mixers of various types. Particularly, double balanced and image reject mixers could be constructed using devices that incorporate embodiments of this invention.

In FIG. 2, the active device is embedded within the substrate, while it protrudes beyond both faces 12a and 12b in the embodiment 10b shown in FIG. 3. The version 10c portrayed in FIG. 4 depicts an active device 14 mounted on one of the faces of the substrate, and FIGS. 5a and 5b furnish illustrations of alternatives 10d and 10e which utilizes a pair of active devices 14d & 14e mounted in registration and across from each other on both faces 12a and 12b. The opposing pair of active devices 14d and 14e may each include one or more pairs of FETs.

Figure 5B:
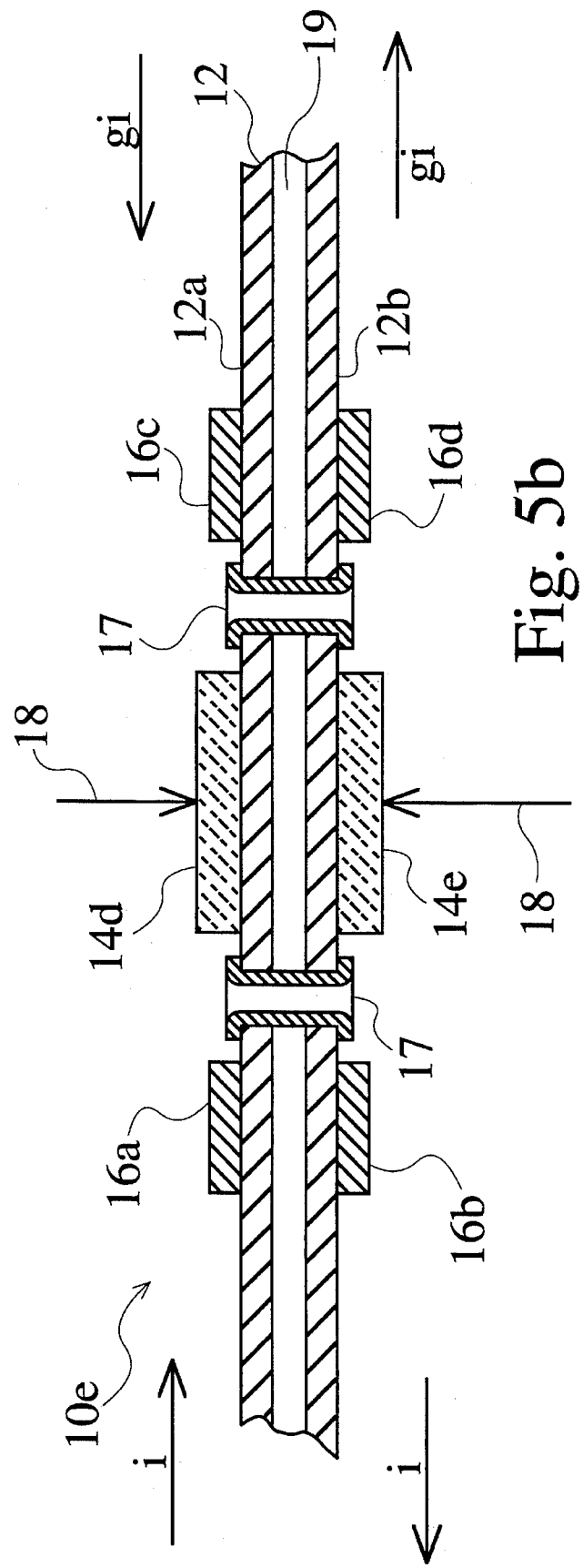
FIG. 5b is a cross-sectional view as shown in FIG. 5a, but includes a heat pipe that extends inside the substrate.

FIG. 5a also depicts electrically conductive vias 17 which extend between faces 12a and 12b to facilitate electrical connections between the circuits on either side of the substrate 12. FIG. 5b is the same as FIG. 5a, but also shows a hollow center section 19 that can be used to remove or temporarily store heat that is formed by active devices. The hollow section 19 contains a liquid, gas or solid material that is capable of conducting unwanted heat away from the active devices or for storing the heat temporarily for a later quiescent period, thus acting as a heat pipe.

Figure 6:
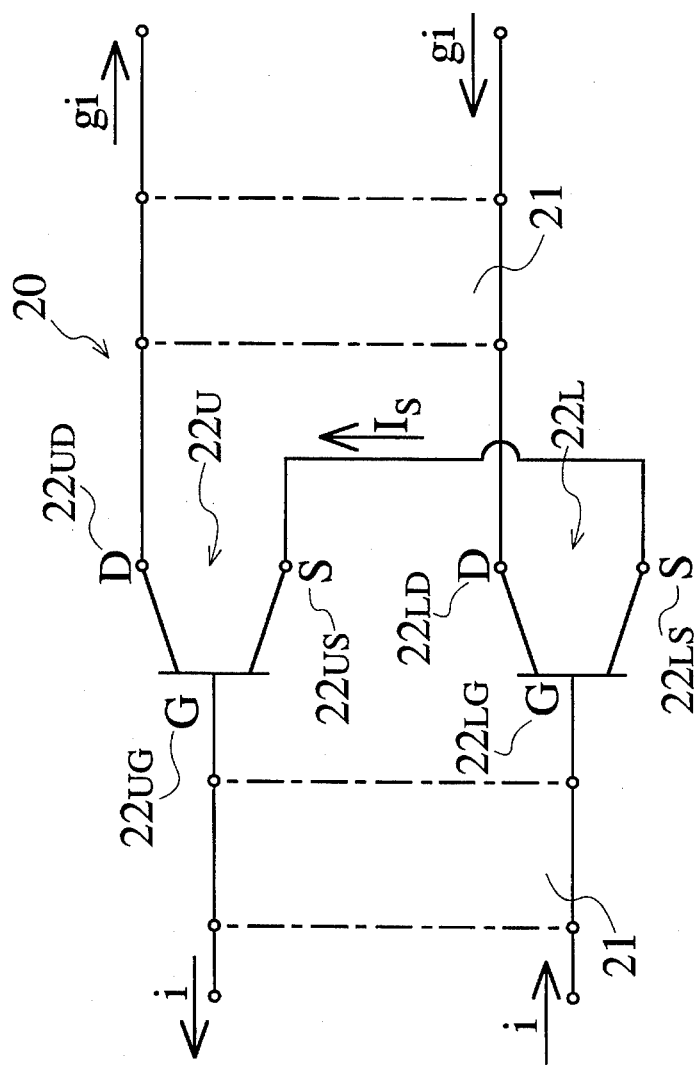
FIG. 6 is a partial schematic depiction of one of the preferred embodiments of the present invention.

FIG. 6 is a partial schematic diagram 20 of the present invention showing one half of the push-pull amplifier. FIG. 6 is not the amplifier PPA shown in FIG. 1. In one of the preferred embodiments of the invention, the circuit includes the upper and lower portions of one of the two field effect transistors 22 and 24. These two FETs 22 and 24 are located on each side of the substrate 12, and serve as the active devices 14d and 14e. Although FIG. 6 reveals the connections between the upper and lower FETs 22, the connections between the upper and lower FETs 24 are basically the same. For the purpose of describing the inter-connection of the active devices, each of the field effect transistors 22 and 24 has its own gate, drain and source. Each one of the pair 22 is an output FET, while the two FETs 24 are input devices. The reference characters used in FIGS. 6 and 8 include three components. The first two characters are numerals which refer to the pairs of FETs 22 or FETs 24. The third character is either a "U" or an "L" that indicates whether the FETs are attached to the upper or the lower face of substrate 12. The fourth character identifies each terminal of a particular FET, either a gate "G", a source "S" or a drain "D". In this embodiment, the sources 22US and 22LS are signal coupled. In the specification and claims, the general term "control terminal" includes the narrower term "gate"; the general term "output terminal" includes the narrower term "drain"; and the general term "common terminal" includes the narrower term "source".

In one embodiment, the active devices 14d & 14e shown in FIG. 5a comprise two pairs of field effect transistors. One pair of FETs 22U and 22L are power FETs, while the other pair of FETs 24U and 24L are driver FETs. An alternative embodiment could utilize only one FET in each active device, so that each side of the substrate would be occupied by a single FET. For the configuration shown in FIG. 5a, the two pairs of active devices are fixed on both faces of the substrate 12. The common lead inductance experienced by the two active devices 14d & 14e is reduced by aligning them in registration directly across the substrate. When a circuit element is said to be aligned in registration directly across the substrate, the mirror image of corresponding circuit patterns reside on each face of the substrate 12 and are separated by a minimum distance that equals the thickness of the substrate. Since common lead inductance between FETs is proportional to their physical separation, minimizing the distance between the two planar circuits cuts the inductance substantially. In the claims which follow, this deployment of pairs of mutually aligned FETs 22U and 22L, and 24U and 24L on both faces of the substrate 12 that minimizes inter-FET source inductance is described by the term "spatially and electrically opposed".

Figure 7:
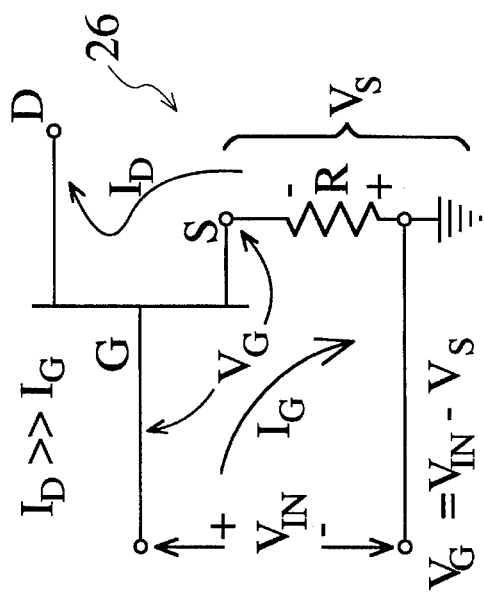
FIG. 7 is a another schematic view of a portion of a preferred embodiment of the present invention.

FIG. 7 is a schematic diagram 26 that helps to explain the importance of controlling common lead inductance. For simplicity of illustration, FIG. 7 shows a resistor, but the actual circuit impedance is inductive. The input signal that the FET will amplify is shown as $V_{IN}$. The common lead impedance will develop a voltage, $V_S$, that will subtract from the input signal $V_{IN}$, and will, in turn, lower the gain.

One consequence of the dual active device configuration is that a virtual ground plane is established along the center of the substrate between the active devices. Because this virtual ground plane is located equidistant from the two sides 12a and 12b of substrate 12 and because of the bilateral symmetry of the circuit, unwanted lateral currents which might otherwise impair the performance of the circuit are substantially eliminated. The present invention is designed to maintain temperature gradients that are also generally symmetric.

Figure 8:
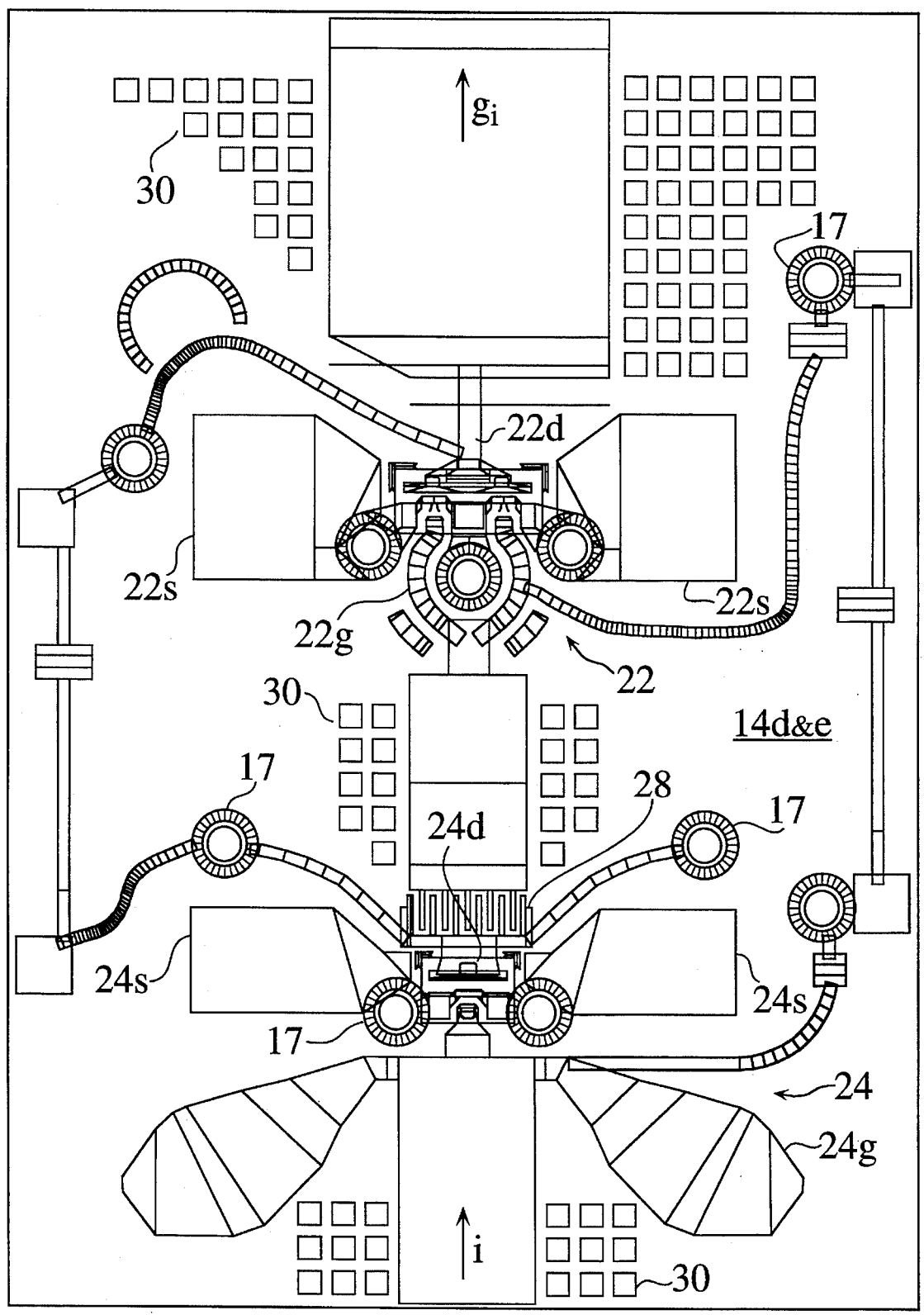
FIG. 8 is a view of one embodiment of the field effect transistor (FET) circuitry that is referred to below as the "power module".

FIG. 8 is a illustration of one side of amplifier 10d showing active devices 14d and 14e. Each active device incorporates two pairs of FETs, 22U and 22L, and 24U and 24L. In the specification and claims, the device shown in a top view in FIG. 8 is referred to as a "power module" 10d. In the embodiment shown in FIGS. 5a and 5b, two identical circuit patterns like the one illustrated in FIG. 8 are located on both faces of the substrate 12. The power module 10d comprises both pairs of FETs 22U and 22L, and 24U and 24L, and their associated circuitry. An input current i is shown entering the gate 24UG of the first FET 24U. Conductive vias 17 connect the FETs attached to the opposite faces 12a and 12b of the substrate 12. The two pairs of FETs 22 and 24 are signal coupled through interdigitated capacitors 28 on each face 12a and 12b. A number of square metal pads called "chicken dots" 30 are placed on each face 12a and 12b to provide for circuit tuning.

Figure 9:
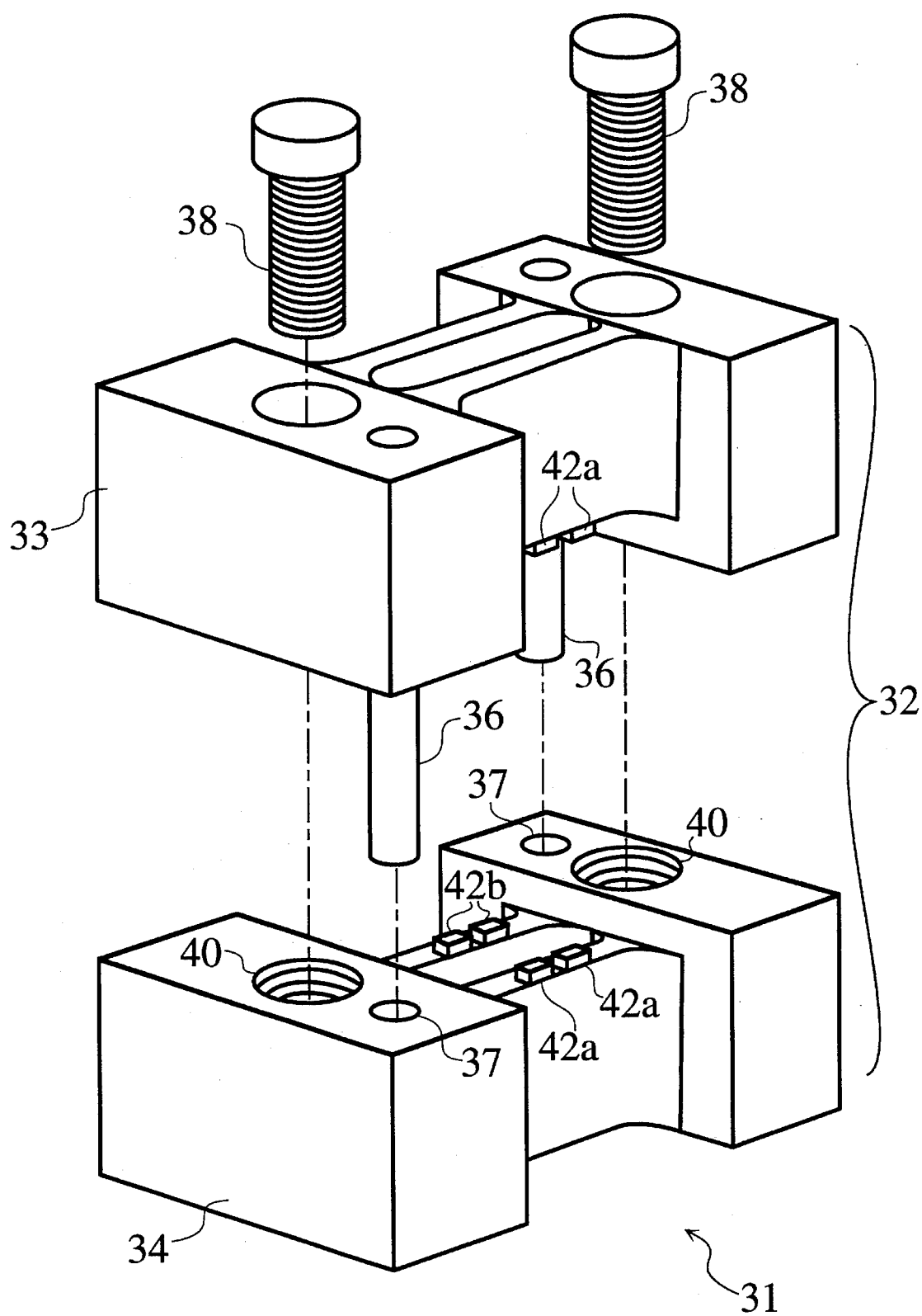
FIG. 9 is a perspective view of a matched pair of heat dissipating grounding clamps.
Figure 10:
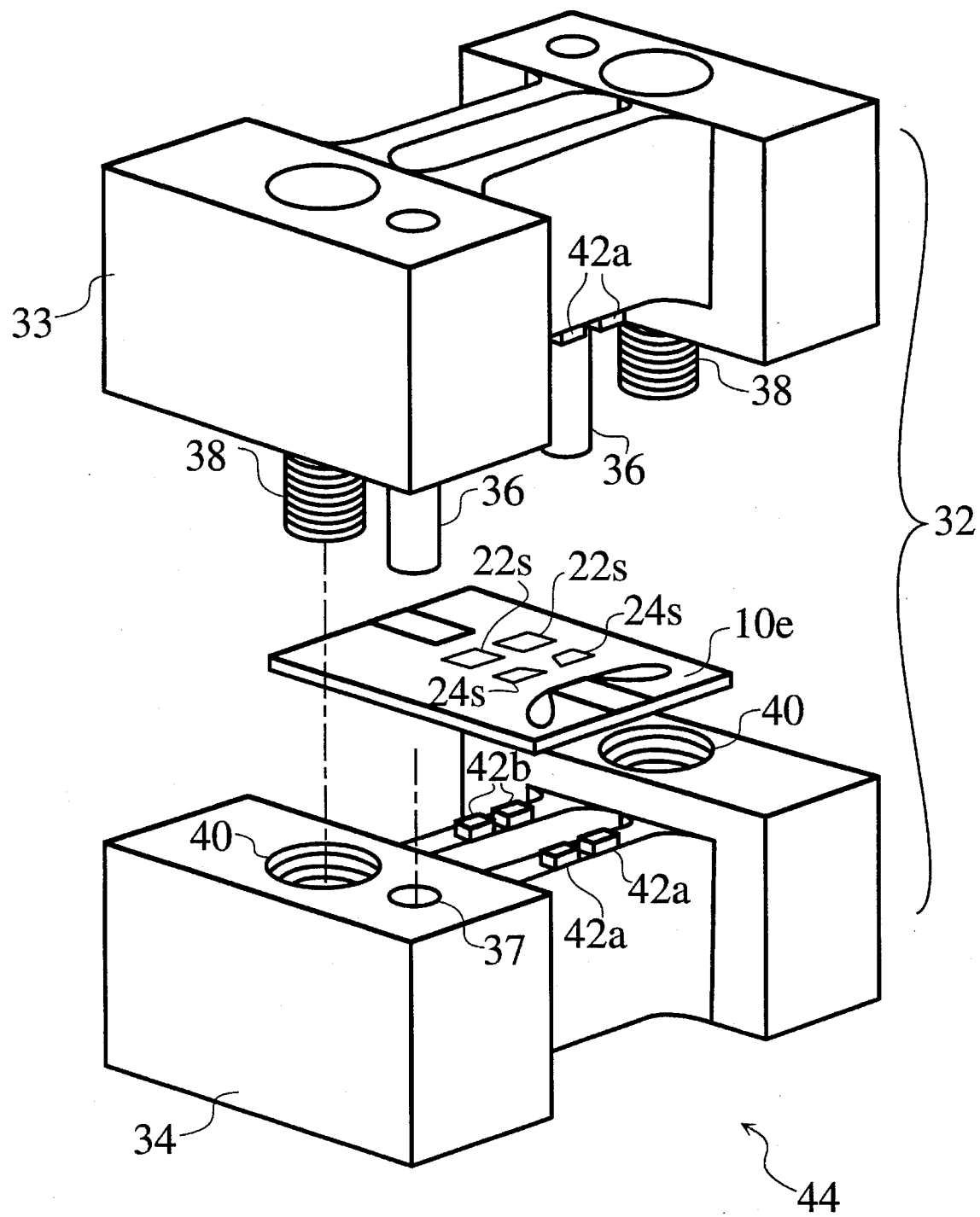
FIG. 10 is an exploded view of the grounding clamps shown in FIG. 9 aligned with a power module.
Figure 11:
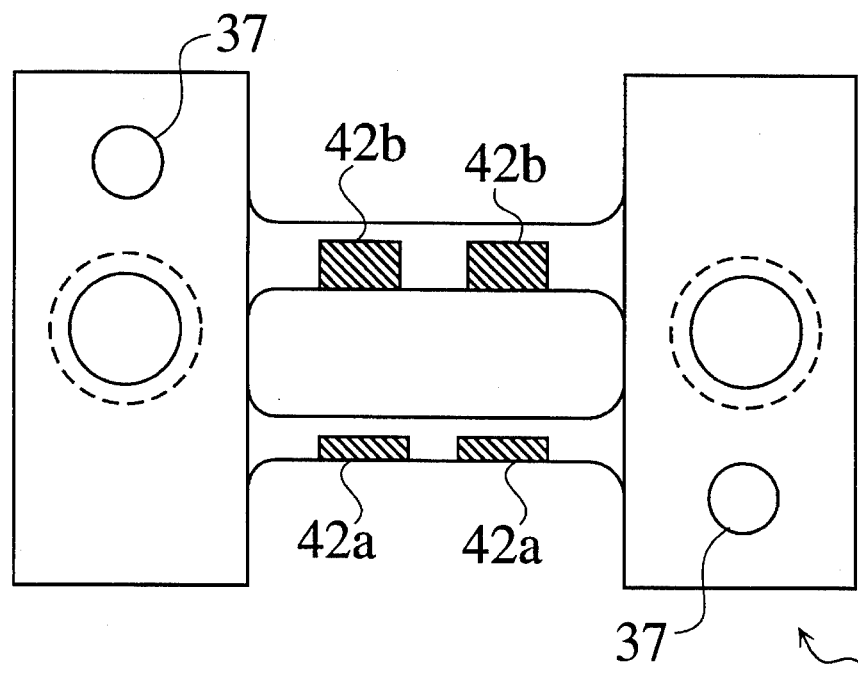
FIG. 11 is a top view of a grounding clamp.
Figure 12:
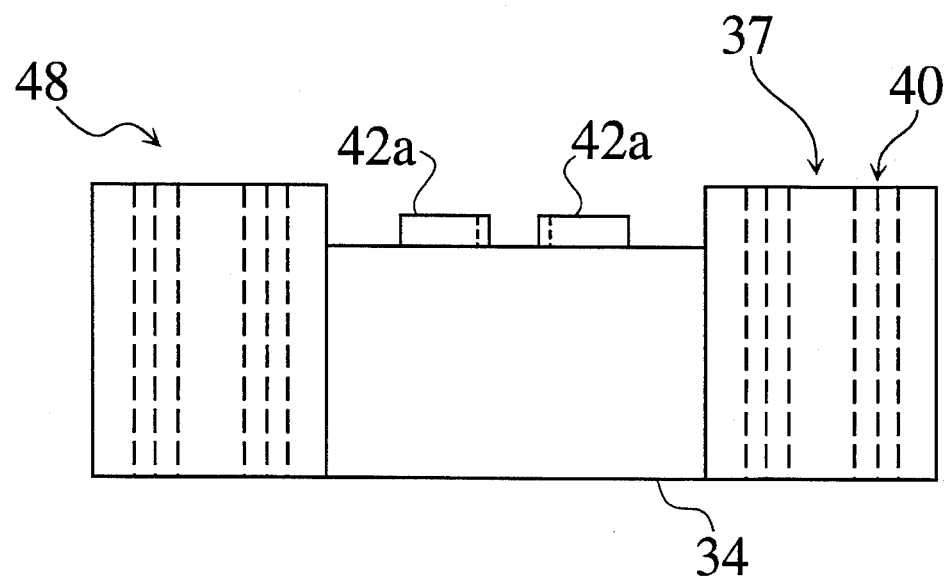
FIG. 12 is a side view of a grounding clamp.

FIG. 9 is a perspective view 31 of a heat dissipating and grounding clamp 32. The clamp 32 includes a top half 33 and a bottom half 34. This clamp is mechanically connected to the power module 10d/10e, and draws heat away from the pads near the FETs that are connected to the sources of each FET. In addition, they provide the electrical ground connection to the power module 10d/10e. In the preferred embodiment of the invention, the clamp 32 is made from gold-plated copper, and includes registration pins 36 and corresponding registration holes 37. Screws 38 that are received by threaded holes 40 couple the halves of the clamp 32 together. A first and a second set of protruding feet 42a and 42b are designed to engage source terminals 22US and 24LS, and 24US and 24LS. FIG. 10 is an illustration 44 which portrays the top half of the clamp 33 positioned over a power module 10d/10e with its feet 42a and 42b aligned over the source terminals 22US and 24US. The two sets of protruding feet 42a and 42b may extend from the clamp 32 in different lengths or widths to match the features of the circuit beneath them. FIG. 11 reveals a top view 46 of one half of the clamp, while FIG. 12 supplies a side view 48.

Figure 13:
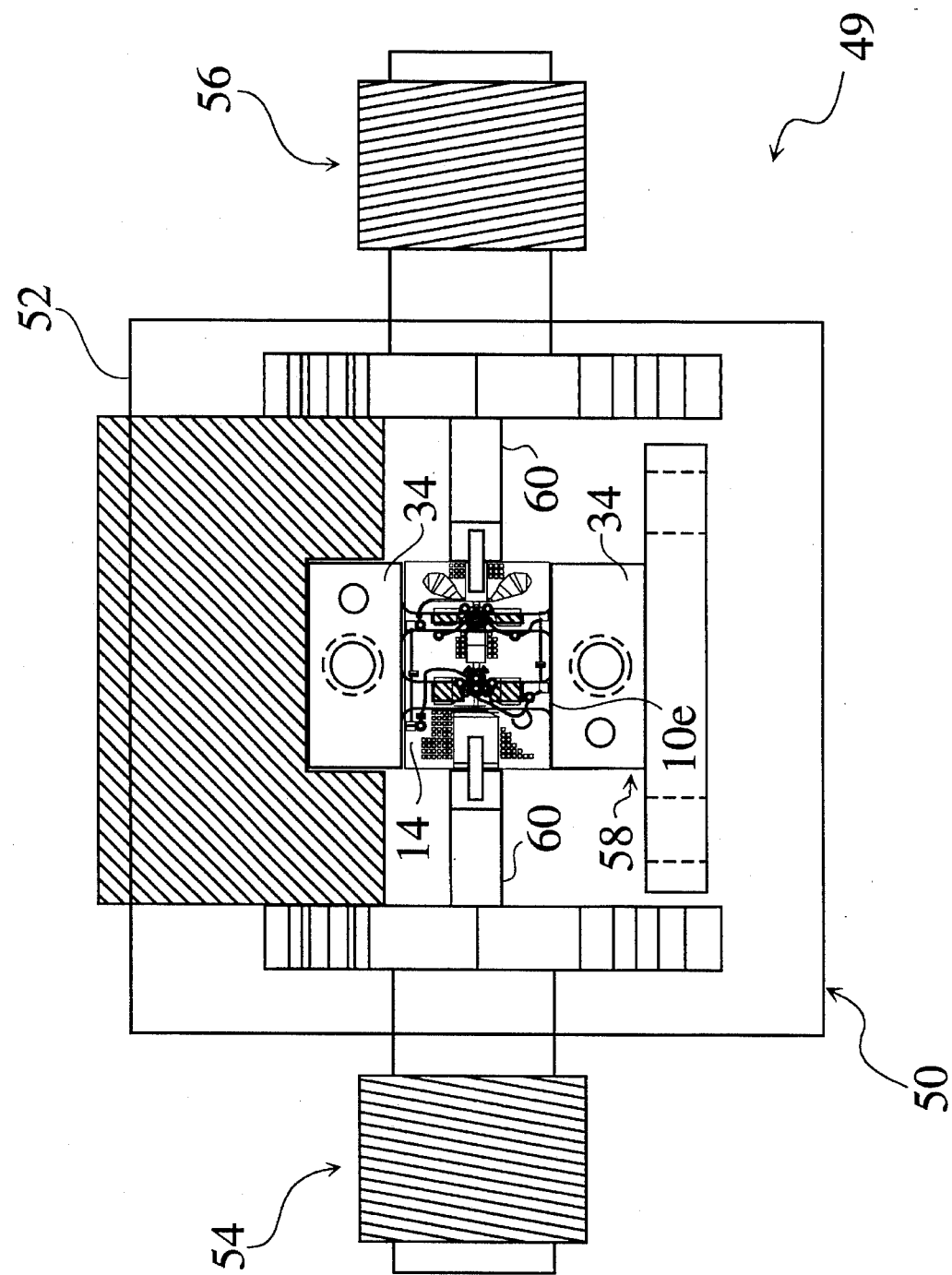
FIG. 13 is an illustration of the test fixture that includes a pair of baluns, a power amplifier module and a heat dissipating grounding clamp.
Figure 14:
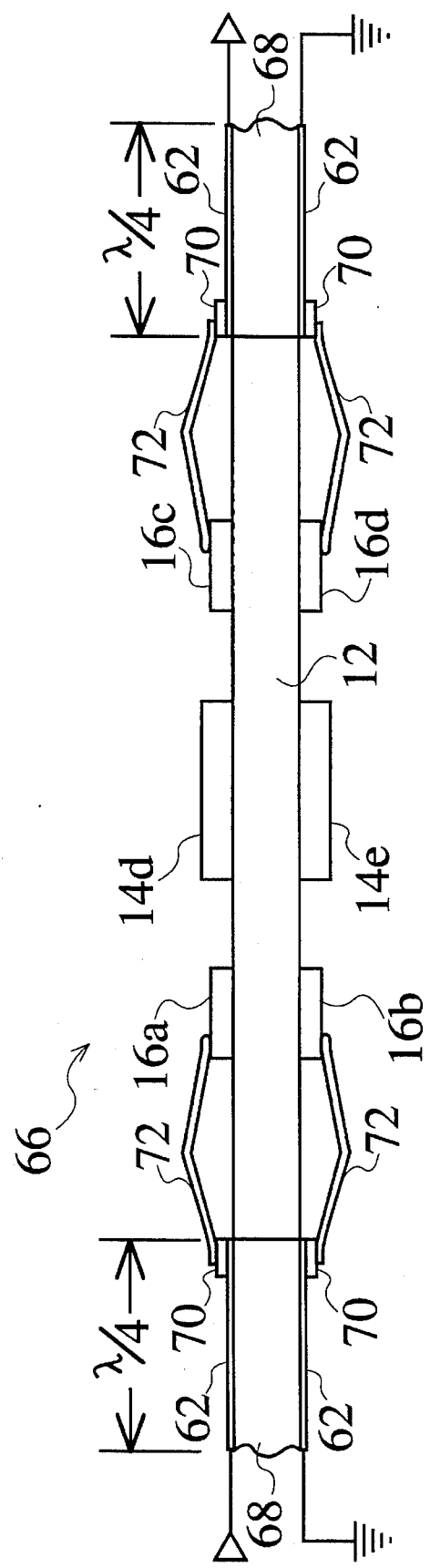
FIG. 14 is a side view of a power amplifier module and conductors connected to a balun at each end.
Figure 15:
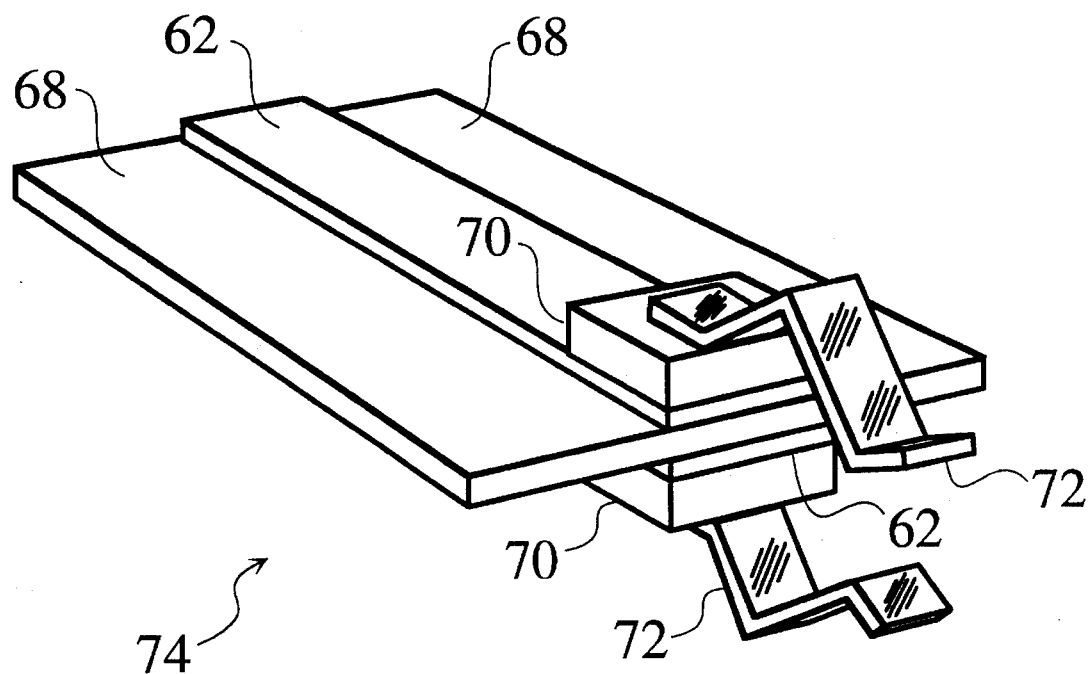
FIG. 15 is a perspective view of the balun structure.
Figure 16:
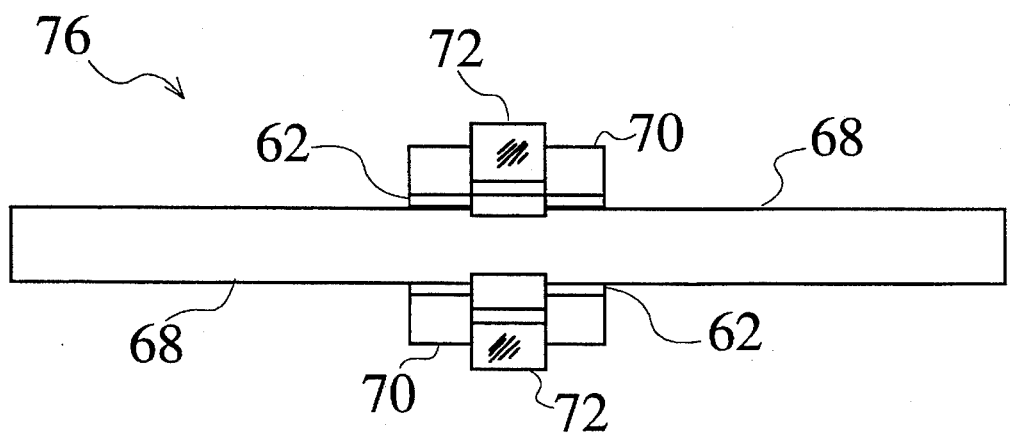
FIG. 16 is an end view of the balun structure shown in FIG. 15.

FIG. 13 offers a view 49 of test fixture 50 comprising a body 52, an input coax connector 54, an output coax connector 56, a cavity 58 and microstrip conductors 60 that serve as the baluns. The test fixture 50 allows the input and output impedances of the power module 10d/10e to be matched to that of external single-ended signals. The test fixture 50 holds a power module 10d/10e with the help of clamp 32. The lower half 34 is shown in FIG. 13. Microstrip conductors 60 are shown connecting coax connectors 54 and 56 to the input and output terminals of the power module 10d/10e. FIG. 14 is a side view 66 of power module 10d/10e with a balun at each end. The length of the microstrip connector 62 comprising each balun is one fourth of the wavelength λ of the operating frequency in the material that was used to make the balun 74. The substrate 12 that holds the active device 14 is adjacent to a 15 mil teflon substrate 68. In alternative embodiments, substrate 68 may be fabricated from other materials, such as Kapton™, various polyimides, plastics, composites or ceramics. A decoupling capacitor 70 measuring approximately 4 by 40 by 40 mils is located at the end of each microstrip 62. A ribbon conductor 72 extends from each capacitor 70 to the terminals of the power module 10d. FIG. 15 offers a perspective view 74 of microstrip balun structure, while FIG. 16 supplies an end view 76.

Figure 17B:
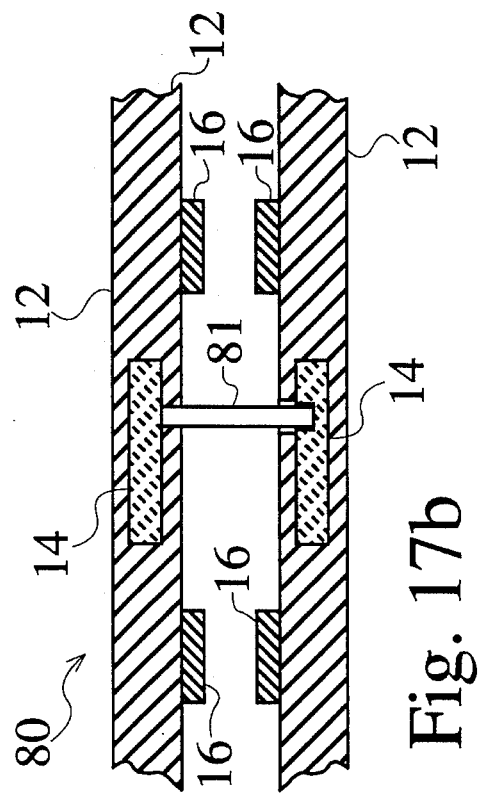
Figure 17A:
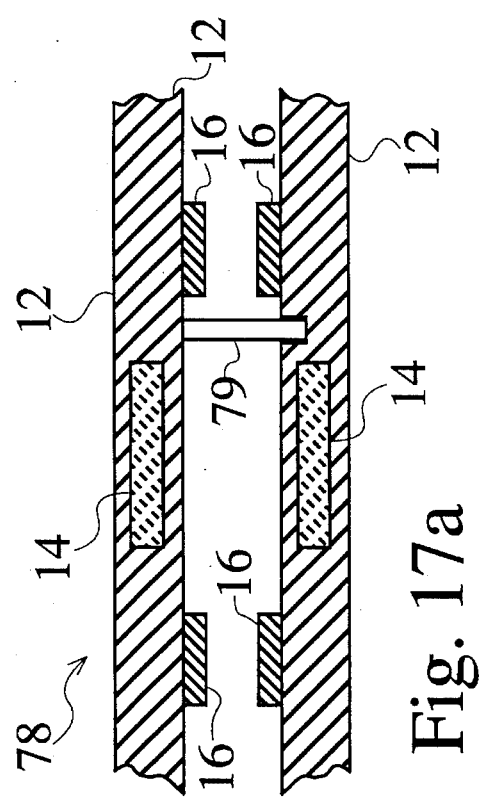
Figure 18:
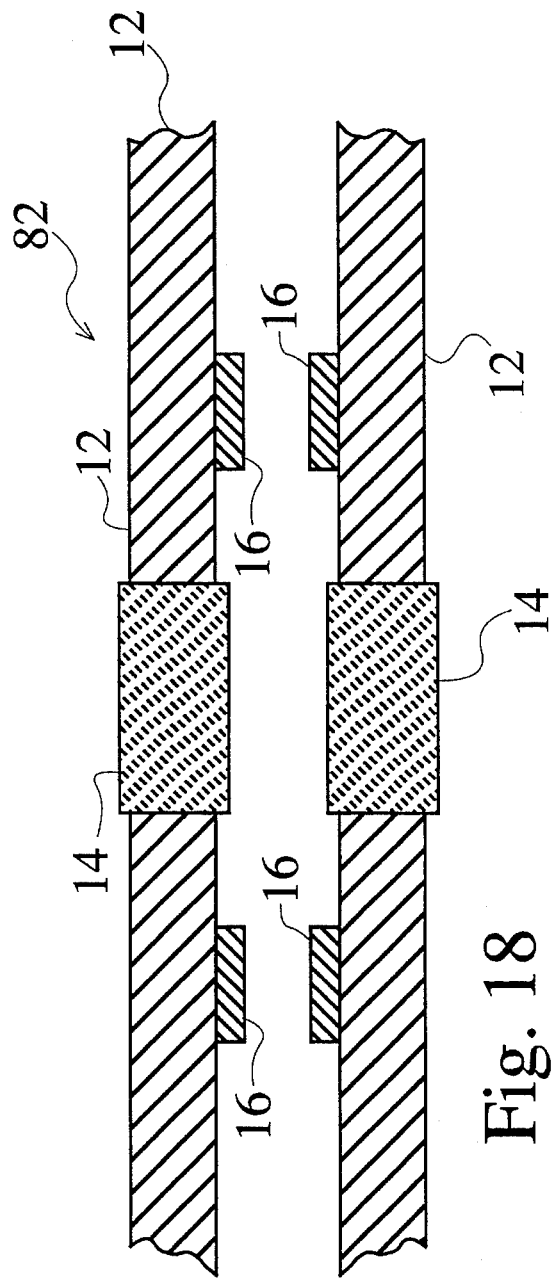
Figure 19:
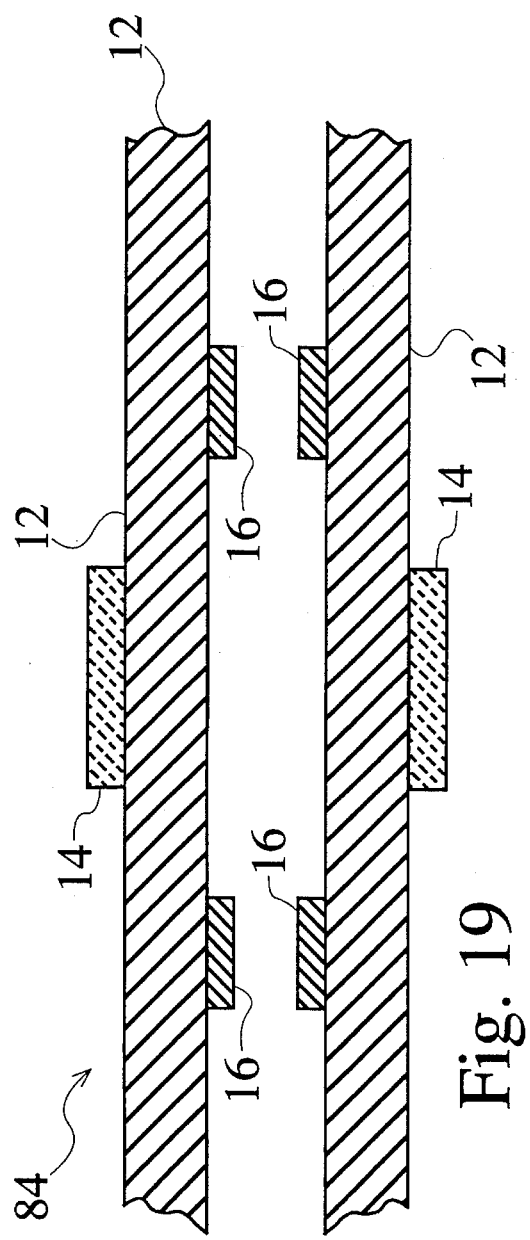
Figure 20:
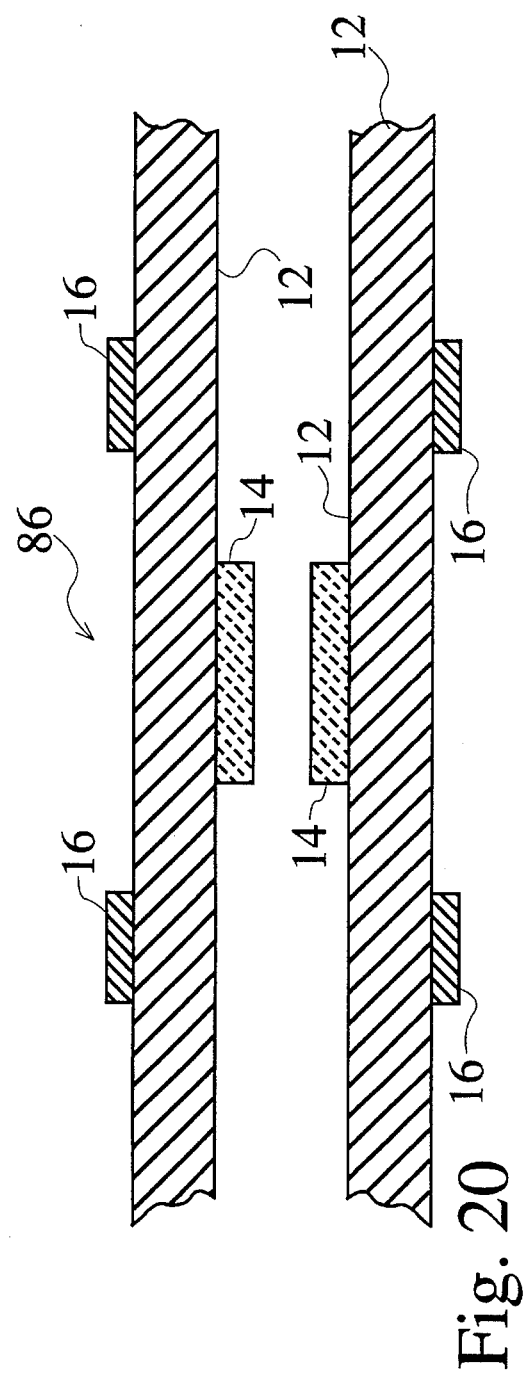
Figure 21:
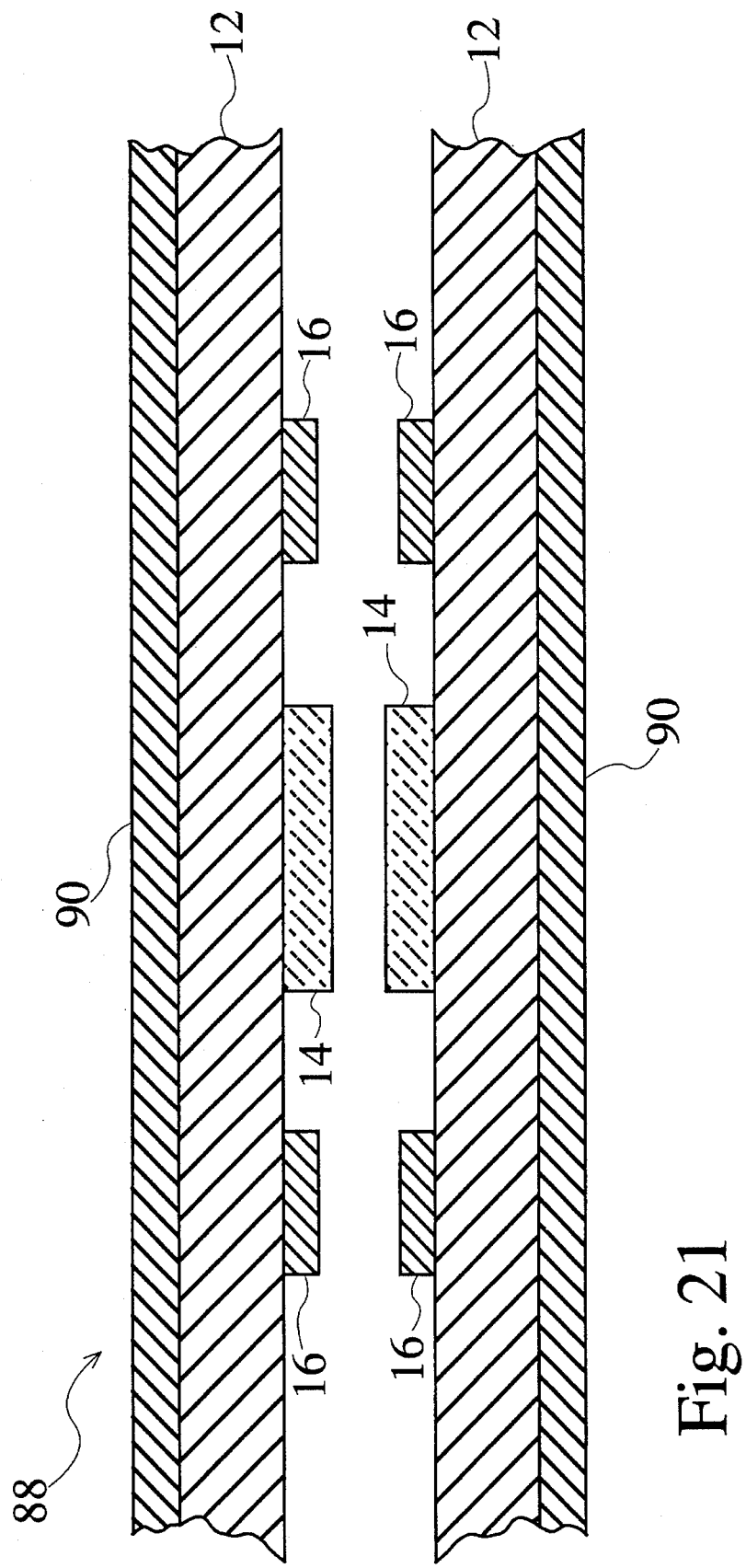

FIGS. 17a, 17b, 18, 19, 20 and 21 reveal additional alternative embodiments of the present invention. In general, these figures show active devices 14 and conductors 16 mounted on pairs of opposed and parallel substrates 12. FIGS. 17a and 17b are views 78 and 80 showing two embedded active devices 14, while FIG. 18 offers a view 82 showing active devices 14 that protrude across the substrates 12. The view 84 in FIG. 19 reveals active devices 14 mounted on the most remote pair of faces of the substrates 12. The view 86 in FIG. 20 portrays two active devices 14 mounted on the two closest faces of the substrates 12. In this embodiment, the conductors 16 are located on the outermost faces. FIG. 21 supplies an illustration 88 that shows both the active devices 14 and conductors residing on the closest faces of the substrate 12. This embodiment also includes metal layers 90 on the most remote pair of faces of the substrate 12. The sources are interconnected either between the substrates 12 as shown in FIG. 17a or between the active devices 14 as shown in FIG. 17b by connectors 79 and 81, respectively.

The preferred embodiments of the invention utilize "flip-chip" manufacturing methods for attaching FETs to the substrate. Other attachment methods that do not use flip-chip methods rely on many wirebonds, which introduce unwanted parasitics. Flip-chip manufacturing methods involve placing bumps on the FET or on the GaAs chip or the substrate to which the FET or chip is mounted. The bumps may be formed by pressing coined gold balls on to the chip or the substrate under moderate temperatures and pressures. Molecular gold-to-gold bonds then cause the chip and the substrate to form a bond. Another method of forming the bumps employs an electroplating process that deposits various metals and solders onto a wafer full of FETs or substrates. After the bumps are fabricated, the wafer is diced, and each die is turned over with the active areas and bumps facing down toward the substrate. The die and the substrate are carefully aligned, the temperature is raised to about 220 degrees Centigrade for gold-gold attachment and the two are compressed together under moderate pressure. This procedure not only eliminates the unwieldy wire leads, but also allows for the disassembly and re-attachment of a replacement chip and the substrate, if repair is required.

The various embodiments of present invention are fabricated using manufacturing processes and methods including high vacuum sputtering or evaporation, metalization, etching, heat treating FET fabrication and machining that are well known to persons ordinarily skilled in the microelectronics arts.

The preferred embodiment is generally a linear amplifier and, as such, has input and output signal frequencies that are essentially the same. This condition is not necessarily satisfied by all the electronic devices that can be fabricated in accordance with the teachings of this specification. It may be advantageous to operate a parametric amplifier in the push-pull module. In this case, the input and output frequencies need not even be related harmonically. A mixer or a harmonic converter could also be made in accordance with the disclosure of this specification.

CONCLUSION

Although the present invention has been described in detail with reference to a particular preferred embodiment, persons possessing ordinary skill in the art to which this invention pertains will appreciate that various modifications and enhancements may be made without departing from the spirit and scope of the claims that follow. The various combination of materials and processes that have been disclosed above are intended to educate the reader about preferred embodiments, and are not intended to constrain the limits of the invention or the scope of the claims. The List of Reference Characters which follows is intended to provide the reader with a convenient means of identifying elements of the invention in the specification and drawings. This list is not intended to delineate or narrow the scope of the claims.

LIST OF REFERENCE CHARACTERS

| | |
|---|---|
| 10 | Dual-Sided Push-Pull Amplifier |
| 12 | Spacing means |
| 14 | Active device |
| 14a | Embedded active device |
| 14b | Protruding active device |
| 14c | Active device mounted on one face |
| 14d | One of a pair of active devices mounted on opposite faces of substrate |
| 14e | One of a pair of active devices mounted on opposite faces of substrate |
| 16 | Conductors |
| 17 | Vias |
| 18 | Power or control input |
| 19 | Heat pipes |
| 20 | Push-pull amplifier partial schematic |
| 21 | Coupled section |
| 22U 22L | Power FETs |
| 22UD 22LD | Drain |
| 22UG 22LG | Gate |
| 22US 22LS | Source |
| 24U 24L | Driver FETs |
| 24UD 24LD | Drain |
| 24UG 24LG | Gate |
| 24US 24LS | Source |
| i | Current |
| gi | Product of gain and current |
| 26 | Schematic showing inter-FET inductance |
| 28 | Interdigitated capacitors |

-continued

LIST OF REFERENCE CHARACTERS

| | |
|---|---|
| 30 | Tuning pads |
| 31 | Perspective view of clamp |
| 32 | Heat dissipating grounding clamps |
| 33 | Top half of clamp |
| 34 | Bottom half of clamp |
| 36 | Registration pins |
| 37 | Registration holes |
| 38 | Screw |
| 40 | Threaded hole |
| 42a | First set of feet |
| 42b | Second set of feet |
| 44 | Grounding clamp aligned over power module |
| 46 | Top view of clamp |
| 48 | Side view of clamp |
| 50 | Test fixture |
| 52 | Body of test fixture |
| 54 | Input coax connector |
| 56 | Output coax connector |
| 58 | Cavity |
| 60 | Microstrip conductor |
| 66 | Side view of power module with microstrip transmission line at each end |
| 68 | Teflon substrate |
| 70 | Decoupling capacitor |
| 72 | Ribbon connector |
| 74 | Perspective view of microstrip balun structure |
| 76 | End view of microstrip balun structure |
| 78 | Cross-sectional view of alternative embodiment |
| 79 | Connectors |
| 80 | Cross-sectional view of alternative embodiment |
| 81 | Connectors |
| 82 | Cross-sectional view of alternative embodiment |
| 84 | Cross-sectional view of alternative embodiment |
| 86 | Cross-sectional view of alternative embodiment |
| 88 | Cross-sectional view of alternative embodiment |
| 90 | Metal layers |

What is claimed is:

1. An apparatus comprising:

a spacing means (12) defining a pair of parallel spaced-apart faces (12a and 12b) for providing support;

an active device means (14) for processing a plurality of input signals (I); said active device means (14) being mechanically coupled to said spacing means (12);

a first pair of conductor means (16a & 16d) for carrying said plurality of input signals (I); said plurality of input signals (I) moving in opposite directions but being substantially identical;

a second pair of conductor means (16c & 16d) for carrying a plurality of output signals (gi); said plurality of output signals (gi) moving in opposite directions but being substantially identical; and both of said first and said second pairs of conductor means (16a & 16b and 16c and 16d) being maintained by said spacing means (12) in a generally symmetrical configuration relative to said active device means (14) with one of said conductor means in each of said first and said second pairs of conductor means being supported on one of said faces, and the other of said conductor means in each of said first and second pairs of conductor means being supported on the other of said faces.

2. An apparatus as recited in claim 1, in which said spacing means (12) is a dual-sided substrate; said dual-sided substrate having said pair of faces (12a & 12b).

3. An apparatus as recited in claim 2, in which said active device means (14a) is embedded centrally between said faces within said substrate (12), and said conductor means (16a, 16b, 16c and 16d) in each of said pairs of conductors means are disposed on opposite sides of said substrate, whereby said active device means is spaced substantially equidistant from each of said conductor means.

4. An apparatus as recited in claim 2, in which said active device means (14b) is mounted within, extends completely through, and protrudes from said faces of said substrate (12), and said conductor means (16a, 16b, 16c and 16d) in each of said pairs of conductors means are disposed on opposite sides of said substrate, whereby said active device means is spaced substantially equidistant from each of said conductor means.

5. An apparatus as recited in claim 2, in which said active device means (14c) is mounted on one of said faces (12a) of said dual-sided substrate (12).

6. An apparatus as recited in claim 2, in which a pair of said active device means (14d & 14e) are mounted on opposite faces (12a & 12b) of said dual-sided substrate (12).

7. An apparatus as recited in claim 6, in which the distance between said pair of said active device means (14d & 14e) is kept to a minimum to minimize the common lead inductance between said pair of said active device means (14d & 14e).

8. An apparatus comprising:

a spacing means (12) for providing support; said spacing means (12) being dual-sided;

a pair of active device means (14d & 14e) for processing a plurality of input signals (i);

said pair of active device means (14d & 14e) being mechanically coupled to said spacing means (12);

said pair of active device means (14d & 14e) each having a control terminal, an output terminal and a common terminal;

said common terminals of said pair of active device means (14d & 14e) being coupled;

said common terminals of said pair of active device means (14d & 14e) being spatially and electrically opposed such that one of said pair of active device means (14d) is deployed on one of said faces (12a) of said spacing means (12), and that the other of said pair of active device means (14e) is deployed on the other of said faces (12b) of said spacing means (12);

said active device means (14d & 14e) also being arranged on said faces (12a & 12b) of said spacing means (12) in spatial registration such that the distances between said common terminals are minimized to minimize common terminal inductance between said active device means (14d & 14e);

a first pair of conductor means (16a & 16b) for carrying said plurality of input signals (i); said plurality of input signals (i) moving in opposite directions but being substantially identical; and a second pair of conductor means (16c & 16d) for carrying a plurality of output signals (gi); said plurality of output signals (gi) moving in opposite directions but being substantially identical.

9. An apparatus as recited in claim 8, in which said active device means (14d and 14e) are fabricated using flip-chip manufacturing methods.

10. An apparatus as recited in claim 1, in which said spacing means (12) comprises a pair of spaced-apart substrates with each of said substrates having one face of said pair of faces.

11. An apparatus as recited in claim 1, in which said spacing means (12) supports said conductor means (16a, 16b, 16c & 16d) in each of said pairs of conductor means (16a & 16b and 16c & 16d) on said faces in spacial alignment such that the distances between said conductor means in each of said pairs of conductor means are minimized.

12. An apparatus as recited in claim 1, in which said conductor means (16a, 16b, 16c and 16d) in each of said pairs of conductors means (16a & 16b and 16c & 16d) are disposed on opposite ones of said faces (12a & 12b), whereby said active device means (14) is spaced substantially equidistant from each of said conductor means in each of said pairs of conductor means.

13. An apparatus as recited in claim 1, in which a pair of said active device means (14d & 14e) are mounted opposite each other on said pair of faces (12a & 12b).

14. An apparatus as recited in claim 13, in which the distance between said pair of active device means (14d & 14e) is kept to a minimum to minimize the common lead inductance between said pair of said active device means (14d & 14e).

* * * * *